US006853082B1

(12) United States Patent
Chen et al.

(10) Patent No.: US 6,853,082 B1
(45) Date of Patent: Feb. 8, 2005

(54) METHOD AND STRUCTURE FOR INTEGRATING METAL INSULATOR METAL CAPACITOR WITH COPPER

(75) Inventors: Zhen Chen, Shanghai (CN); Wong Chen Shih, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 10/773,954

(22) Filed: Feb. 6, 2004

(30) Foreign Application Priority Data

Dec. 30, 2003 (CN) .................................. 200310122962 A

(51) Int. Cl.⁷ .............................................. H01L 23/12
(52) U.S. Cl. ..................... 257/762; 257/774; 257/758; 257/708; 438/687
(58) Field of Search ................................ 257/762, 774, 257/758, 708; 438/687

(56) References Cited

U.S. PATENT DOCUMENTS 6,384,442 B1 * 5/2002 Chen ........................... 257/298

* cited by examiner

*Primary Examiner*—Fetsum Abraham
(74) *Attorney, Agent, or Firm*—Townsend and Townsend and Crew, LLP

(57) ABSTRACT

An integrated circuit device and methods of producing such device. The device has a substrate, e.g., silicon. An insulating layer is formed overlying the substrate. A copper metal layer is overlying the insulating layer. The device also has an etch stop layer overlying the copper metal layer and an interlayer dielectric material overlying the etch stop layer. The interlayer dielectric material includes an upper surface. A plurality of via openings are defined within a region of the interlayer dielectric layer from the upper surface through the etch stop layer to the copper metal layer. The device has a copper fill material within each of the plurality of via openings to define a plurality of copper structure extending from the upper surface through the etch stop layer to the copper metal layer. A first barrier metal layer is overlying each of the plurality of copper structures to define a first electrode of a capacitor structure. An insulating layer is overlying the first barrier metal layer to define an insulating layer for the capacitor structure. The device has a second barrier metal layer overlying the insulating layer to define the second electrode of the capacitor structure.

20 Claims, 8 Drawing Sheets

METHOD AND STRUCTURE FOR INTEGRATING METAL INSULATOR METAL CAPACITOR WITH COPPER

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits and their processing for the manufacture of semiconductor devices. More particularly, the invention provides a method and device for manufacturing a capacitor structure in a dual damascene metal interconnect for integrated circuits. Merely by way of example, the invention has been applied to a copper dual damascene structure for advanced integrated circuit devices such as mixed signal devices. But it would be recognized that the invention has a much broader range of applicability. For example, the invention can be applied to other types of metal layer such as tungsten, aluminum, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of a technique that allows for smaller feature sizes is called the dual damascene structure. Such damascene structure is often made of copper material for multi-level interconnect designs of conventional integrated circuit devices. High-speed microprocessors have used such damascene structure, as well as others.

The dual damascene structure includes a first copper metal layer and a second copper metal layer. Conventional copper structures are well known in the art. Although such structure has many benefits, there are still limitations. For example, such damascene structure includes copper material itself that migrates and causes problems with adjacent dielectric materials. Accordingly, barrier metal layers should often be used to maintain the copper from contact with dielectric materials. The damascene structure is also difficult to integrate with other device elements such as capacitors. An example of such a capacitor is a metal insulator metal capacitor, which is used for certain mixed signal integrated circuit devices. These and other limitations are described throughout the present specification and more particularly below.

From the above, it is seen that an improved technique for processing semiconductor devices including interconnect structures is desired.

BRIEF SUMMARY OF THE INVENTION

According to the present invention, techniques including methods for the manufacture of semiconductor devices are provided. More particularly, the invention provides a method and device for manufacturing a capacitor structure in a dual damascene metal interconnect for integrated circuits such as mixed signal devices. Merely by way of example, the invention has been applied to a copper dual damascene structure for advanced integrated circuit devices. But it would be recognized that the invention has a much broader range of applicability. For example, the invention can be applied to other types of metal layer such as tungsten, aluminum, and others.

In a specific embodiment, the invention provides an integrated circuit device. The device has a substrate, e.g., silicon. An insulating layer is formed overlying the substrate. A copper metal layer is overlying the insulating layer. The device also has an etch stop layer (e.g., silicon nitride) overlying the copper metal layer and an interlayer dielectric material overlying the etch stop layer. The interlayer dielectric material includes an upper surface. A plurality of via openings are defined within a region of the interlayer dielectric layer from the upper surface through the etch stop layer to the copper metal layer. The device has a copper fill material within each of the plurality of via openings to define a plurality of copper structure extending from the upper surface through the etch stop layer to the copper metal layer. A first barrier metal layer (e.g., titanium, titanium nitride, tantalum, tantalum nitride, aluminum, any combination of these to form sandwiched structures) is overlying each of the plurality of copper structures to define a first electrode of a capacitor structure. An insulating layer (e.g., silicon nitride, silicon dioxide, multilayered dielectrics) is overlying the first barrier metal layer to define an insulating layer for the capacitor structure. The device has a second barrier metal layer (e.g., titanium, titanium nitride, tantalum, tantalum nitride) overlying the insulating layer to define the second electrode of the capacitor structure.

In an alternative specific embodiment, the invention includes a method for fabricating and integrated circuit device structure. The method includes providing a substrate and forming an insulating layer overlying the substrate. The method forms a copper metal layer overlying the insulating layer and an etch stop layer overlying the copper metal layer. An interlayer dielectric material is formed overlying the etch stop layer. The interlayer dielectric material includes an upper surface. A plurality of via openings are defined within a region of the interlayer dielectric layer from the upper surface through the etch stop layer to the copper metal layer.

The method forms a copper fill material within each of the plurality of via openings to define a plurality of copper structure extending from the upper surface through the etch stop layer to the copper metal layer. The method also forms a first barrier metal layer overlying each of the plurality of copper structures to define a first electrode of a capacitor structure. An insulating layer is formed overlying the first barrier metal layer to define an insulating layer for the capacitor structure. A second barrier metal layer is formed overlying the insulating layer to define the second electrode.

In an alternative specific embodiment, the invention includes an alternative embodiment of an integrated circuit device. The device has a substrate and an insulating layer overlying the substrate. The device has a copper metal interconnect layer overlying the insulating layer and a capping layer overlying the copper interconnect metal layer to isolate the copper metal interconnect layer form overlying structures. A first barrier metal layer is overlying the capping layer. The first barrier metal layer being free from the copper interconnect layer to define a first electrode structure. The device has an insulating layer overlying the first barrier metal layer to define a capacitor dielectric structure and a second barrier metal layer overlying the insulating layer to define a second electrode structure. An etch stop layer is formed overlying the second barrier metal layer and an interlayer dielectric material is overlying the etch stop layer. The interlayer dielectric material includes an upper surface. A plurality of via openings are defined within a region of the interlayer dielectric layer from the upper surface through the etch stop layer to the second barrier metal layer. A copper fill material is within each of the plurality of via openings to define a plurality of copper structure extending from the upper surface through the etch stop layer to the second barrier metal layer. An upper metal layer formed overlying the plurality of copper metal structures.

In yet an alternative specific embodiment, the invention provides a method for manufacturing integrated circuit devices. The method includes providing a substrate and forming an insulating layer overlying the substrate. The method also includes forming a copper metal interconnect layer overlying the insulating layer and forming a capping layer overlying the copper interconnect metal layer to isolate the copper metal interconnect layer from overlying structures. Preferably, the capping layer does not allow copper to interact and detrimentally influence processing that occurs after forming the copper layer. The method includes forming a first barrier metal layer overlying the capping layer. The first barrier metal layer is free from contact with the copper interconnect layer to define a first electrode structure, although there may be electrical connections from the barrier metal layer to the copper in a certain region. The method includes forming an insulating layer overlying the first barrier metal layer to define a capacitor dielectric structure. A second barrier metal layer is formed overlying the insulating layer to define a second electrode structure. An etch stop layer is formed overlying the second barrier metal layer. The method also includes forming an interlayer dielectric material including an upper surface overlying the etch stop layer, the interlayer dielectric material including an upper surface. A plurality of via openings are defined within a region of the interlayer dielectric layer from the upper surface through the etch stop layer to the second barrier metal layer. A copper fill material is provided within each of the plurality of via openings to define a plurality of copper structure extending from the upper surface through the etch stop layer to the second barrier metal layer. The method also forms an upper metal layer formed overlying the plurality of copper metal structures.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides a substantially flat and smooth first and second electrode, which are not subject to "dishing issues" of conventional processes. As such, capacitance can be controlled over a wide variety of devices and process conditions. Additionally, the capacitor structure can provide a reliable capacitor ranging from 0.5 to 4 Fempto Farads depending upon the application. The structure also applies to devices having 0.25 micron and less design rules, depending upon the application. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques including methods for the manufacture of semiconductor devices are provided. More particularly, the invention provides a method and device for manufacturing a capacitor structure in a dual damascene metal interconnect for integrated circuits such as mixed signal devices. Merely by way of example, the invention has been applied to a copper dual damascene structure for advanced integrated circuit devices. But it would be recognized that the invention has a much broader range of applicability. For example, the invention can be applied to other types of metal layer such as tungsten, aluminum, and others.

Figure 1:
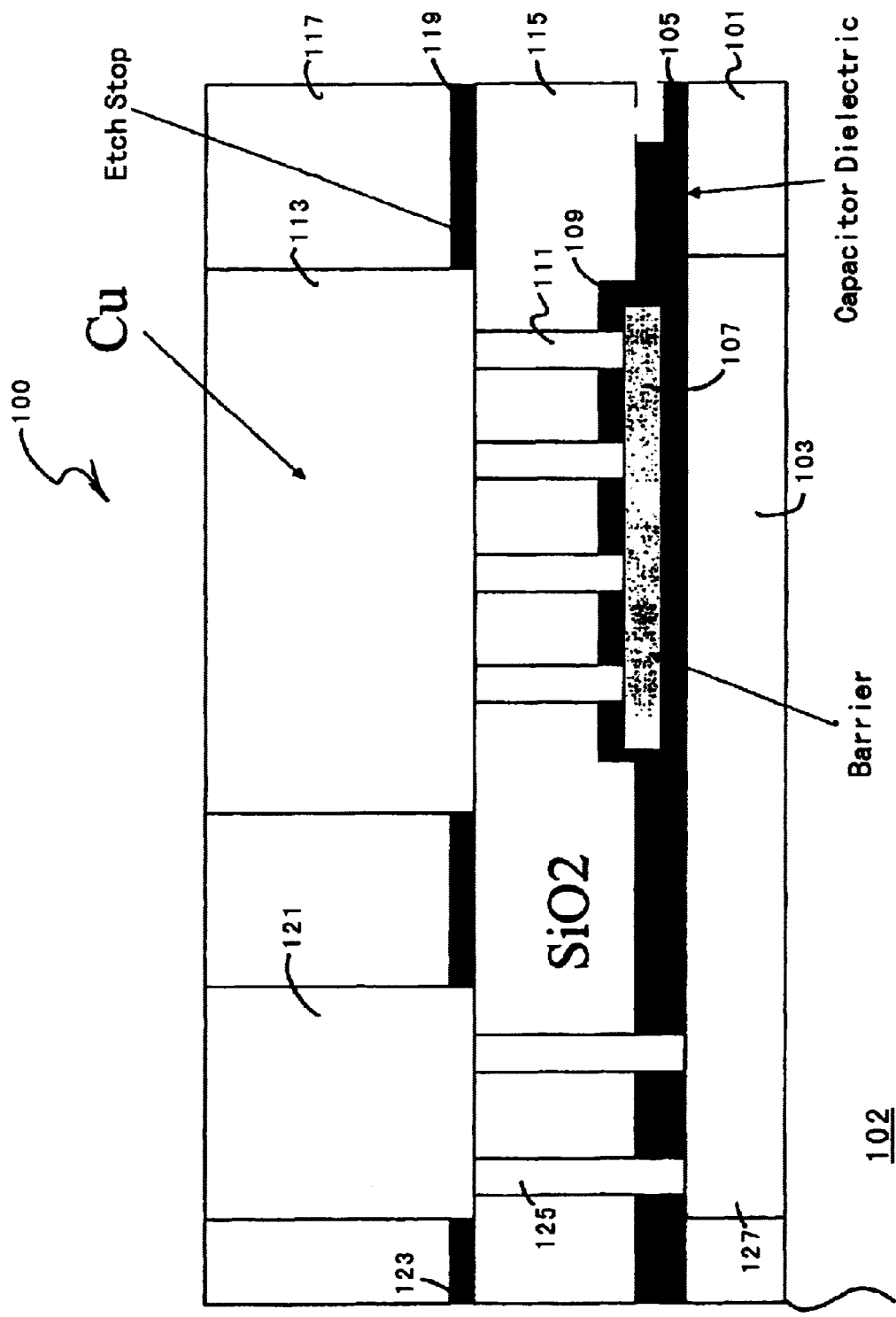
FIGS. 1 is a simplified side-view diagram of a conventional capacitor structure.

FIG. 1 is a simplified side-view diagram 100 of a conventional capacitor structure. This diagram is merely an example, which should not unduly limit the scope of the claims herein. One of ordinary skill in the art would recognize many limitations, variations, and alternatives. As shown, the conventional capacitor structure 100 includes substrate 102, which is often a silicon substrate, but can be others. The substrate includes overlying insulating layer 101. A patterned metal layer 103 is overlying the substrate, as well. The patterned metal layer is often copper material and forms the bottom electrode of the capacitor structure.

The structure also includes a dielectric layer 105 overlying the patterned metal layer. The dielectric layer defines the capacitor dielectric, which sits on the bottom electrode. The dielectric layer has an overlying barrier metal layer 107, which serves as the upper electrode of the capacitor structure. An overlying capping layer 109 is provided over the barrier metal layer. A plurality of via structures 111 connects to the upper electrode through inter-dielectric layer 115 and through the capping layer 109. Also shown is an upper metal layer 113 defined within dielectric layer 117, which sits overlying etch stop layer 119. Accordingly, the capacitor structure is shown.

The side-view diagram also includes a metal interconnect structure, which includes upper metal layer 121, which connects to lower metal layer 127. The lower metal layer sits on an underlying insulating layer overlying the substrate. The lower metal layer is also patterned within dielectric layer 101, as shown. Overlying dielectric layer 105 and inter-dielectric layer 115 separate the upper metal layer from the lower metal layer. A plurality of via structures 125 connects the upper metal layer to the lower metal layer. The metal interconnect structure is formed along the capacitor structure.

Numerous limitations exist with the conventional capacitor structure. For example, the lower electrode 101, which is made of copper, comes directly in contact with the capacitor dielectric material. The copper often migrates to the dielectric layer and causes such layer to change its characteristics. That is, the dielectric constant of such layer is often reduced or becomes poisoned from the copper ions, which diffuse from the copper layer to the dielectric layer. Additionally, the conventional capacitor structure is often difficult to manufacture. That is, certain processes that are performed after forming the lower electrode are incompatible with the copper process. These and other limitations are described throughout the present specification and more particularly below.

Figure 2:
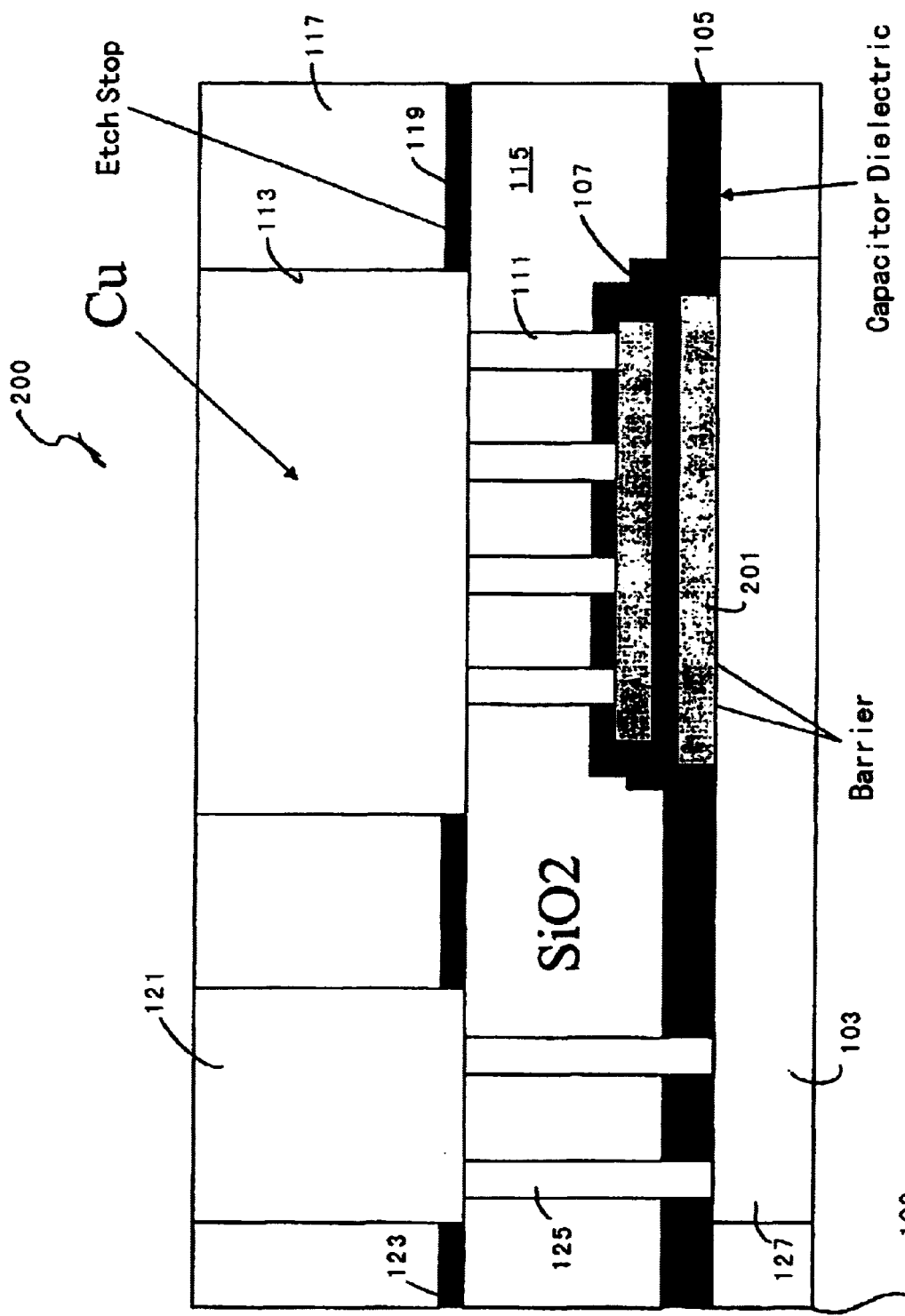
FIG. 2 is a simplified side-view diagram of a capacitor structure according to an embodiment of the present invention.
Figure 3:
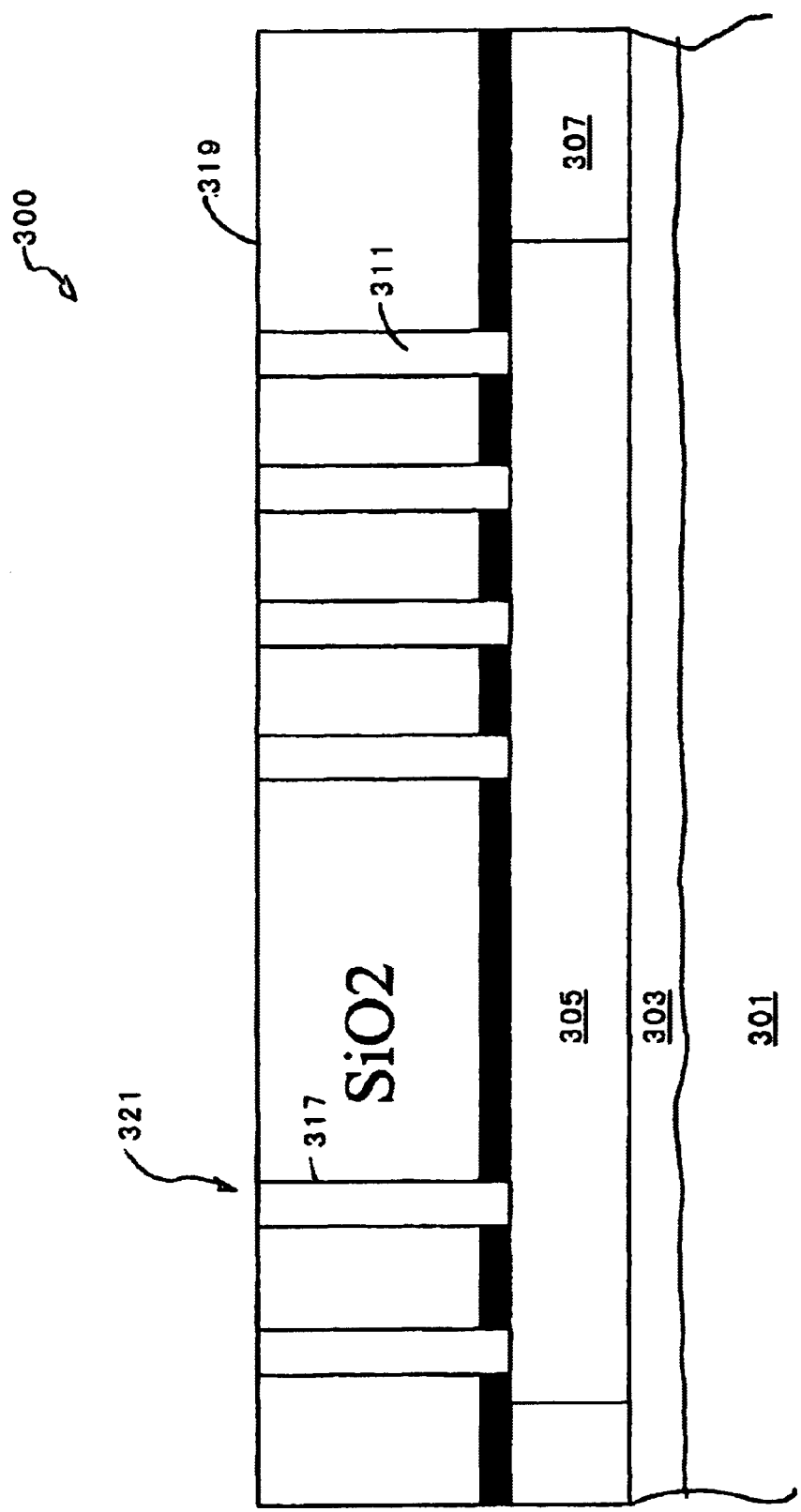
FIGS. 3 through 5 are simplified side-view diagrams of a method for forming a capacitor structure and resulting capacitor structure according to an embodiment of the present invention.

FIG. 2 is a simplified side-view diagram 200 of a capacitor structure according to an embodiment of the present invention. This diagram is merely an example, which should not unduly limit the scope of the claims herein. One of ordinary skill in the art would recognize many limitations, variations, and alternatives. Like reference numerals are used in this Figure as the previous Figure, but are not intended to be limiting. As shown, the capacitor structure 100 includes substrate 102, which is often a silicon substrate, but can be others. The substrate includes overlying insulating layer 101. Patterned metal layer 103 is overlying the substrate, as well.

A patterned barrier metal layer 201 is overlying a portion of the metal layer. As noted, the patterned metal layer is often copper material, which leads to migration issues. The patterned barrier metal layer presents copper material from diffusing into the capacitor dielectric material 105, which is overlying the patterned metal layer. The dielectric layer defines the capacitor dielectric, which sits on the bottom electrode. The dielectric layer has an overlying barrier metal layer 107, which serves as the upper electrode of the capacitor structure. Capping layer 109 is provided over the barrier metal layer. A plurality of via structures 111 connects to the upper electrode through inter-dielectric layer 115 and through the capping layer 109. Also shown is upper metal layer 113 defined within dielectric layer 117, which sits overlying etch stop layer 119. Accordingly, the capacitor structure is shown.

The side-view diagram also includes the metal interconnect structure, which includes upper metal layer 121, which connects to lower metal layer 127. The lower metal layer sits on an underlying insulating layer overlying the substrate. The lower metal layer is also patterned within dielectric layer 101, as shown. Overlying dielectric layer 105 and inter-dielectric layer 115 separate the upper metal layer from the lower metal layer. Via structures 125 connect the upper metal layer to the lower metal layer. The metal interconnect structure is formed along the capacitor structure.

The patterned barrier metal layer can be patterned using a lithograph and etching process. In certain embodiments, an etch stop layer should be formed overlying the metal layer, which can be copper. Certain difficulty may exist in using the copper as the etch stop. Of course, one of ordinary skill in the art would recognize many variations, alternatives, and modifications. A method and resulting structure for an alternative embodiment of the present invention are provided below.

A method according to an embodiment of the present invention can be briefly provided as follows:

1. Provide a substrate;
2. Form an insulating layer overlying the substrate;
3. Form a copper metal layer overlying the insulating layer;
4. Form an etch stop layer overlying the copper metal layer;
5. Form an interlayer dielectric material having an upper surface overlying the etch stop layer;
6. Form a plurality of via openings defined within a region of the interlayer dielectric layer from the upper surface through the etch stop layer to the copper metal layer;
7. Form a copper fill material within each of the plurality of via openings to define a plurality of copper structure extending from the upper surface through the etch stop layer to the copper metal layer;
8. Form a first barrier metal layer overlying each of the plurality of copper structures to define a first electrode of a capacitor structure;
9. Form an insulating layer overlying the first barrier metal layer to define an insulating layer for the capacitor structure;
10. Forming a second barrier metal layer overlying the insulating layer to define the second electrode; and
11. Perform other steps, as desired.

The above sequence of steps provides a method according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

FIGS. 3 through 6 are simplified side-view diagrams 300 of a method for forming a capacitor structure and resulting capacitor structure according to an embodiment of the present invention. These diagrams are merely examples, which should not unduly limit the scope of the claims herein. One of ordinary skill in the art would recognize many limitations, variations, and alternatives. As shown, the method includes providing a substrate 301, e.g., silicon wafer or the like, including silicon on insulator. The method includes forming an insulating layer 303 overlying the substrate. The insulating layer can include a silicon dioxide, a silicon nitride, any combination of these, as well as multilayered structures.

The method forms a metal layer 305 overlying the insulating layer. Preferably, the metal layer is a copper metal layer overlying the insulating layer. The copper metal layer is formed using a damascene process, which integrates the copper within dielectric layer 307. An etch stop layer 309 is formed overlying the copper metal layer. The etch stop layer can include a silicon nitride or other suitable material. The method also forms an interlayer dielectric material 315 overlying the etch stop layer. The interlayer dielectric material includes an upper surface. The interlayer dielectric material can be selected from an oxide, a nitride, any combination of these, doped oxides, such as BPSG (borophosphosilicaglass), PSG (phosphosilicaglass), or FSG (fluorinated silicon glass), and other low K materials. The method includes forming a plurality of via openings 311 defined within a region of the interlayer dielectric layer from the upper surface through the etch stop layer to the copper metal layer. A copper fill material is provided within each of the plurality of via openings to define a plurality of copper structure extending from the upper surface through the etch stop layer to the copper metal layer. Preferably, the copper fills the vias and any extending portions of copper are planarized using chemical mechanical planarization. The planarized surface yields a region 319 for a bottom electrode of a capacitor structure.

Figure 4:
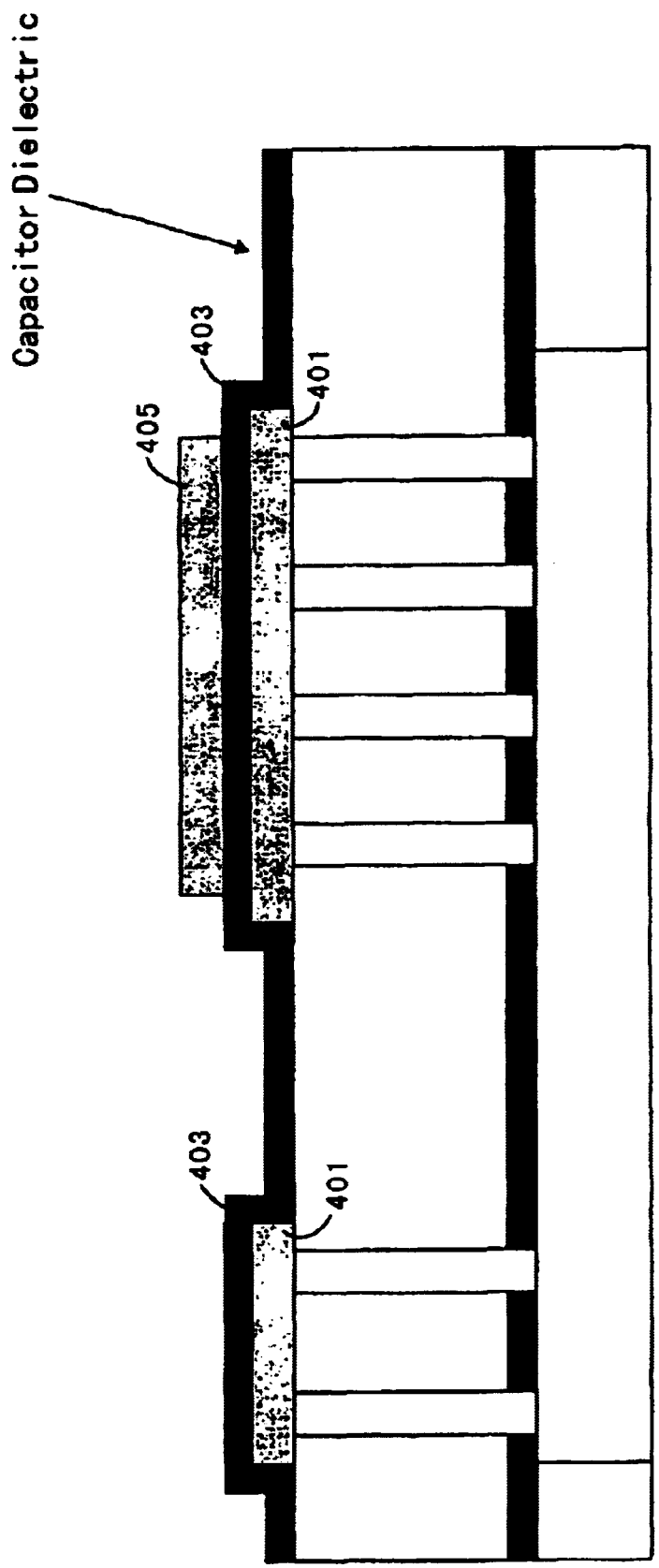

Preferably, the method also forms structures corresponding to an interconnect 321. Such interconnect includes vias 317, which extend from the surface region to the copper layer through the interlayer dielectric and etch stop layer. Referring to FIG. 4, the method includes forming a first barrier metal layer 401 overlying each of the plurality of copper structures to define a first electrode of the capacitor structure. The barrier metal also is also used for the interconnect structure. The barrier metal layer, which is patterned, defines a first electrode structure of a capacitor. The barrier metal layer can include tantalum-bearing materials, such as tantalum nitride and tantalum, titanium bearing materials such as titanium and titanium nitride, as well as other alternatives.

The method also forms an insulating layer 403 overlying the first barrier metal layer to define an insulating layer for the capacitor structure. The insulating layer can include silicon dioxide, silicon nitride, any combination of these, multilayered structures and composites, and the like. The method includes forming a second barrier metal layer 405 overlying the insulating layer to define the second electrode and complete the capacitor structure. The barrier metal layer, which is patterned, defines a first electrode structure of a capacitor. The barrier metal layer can include tantalum-bearing materials, such as tantalum nitride and tantalum, titanium bearing materials such as titanium and titanium nitride, as well as other alternatives.

Figure 5:
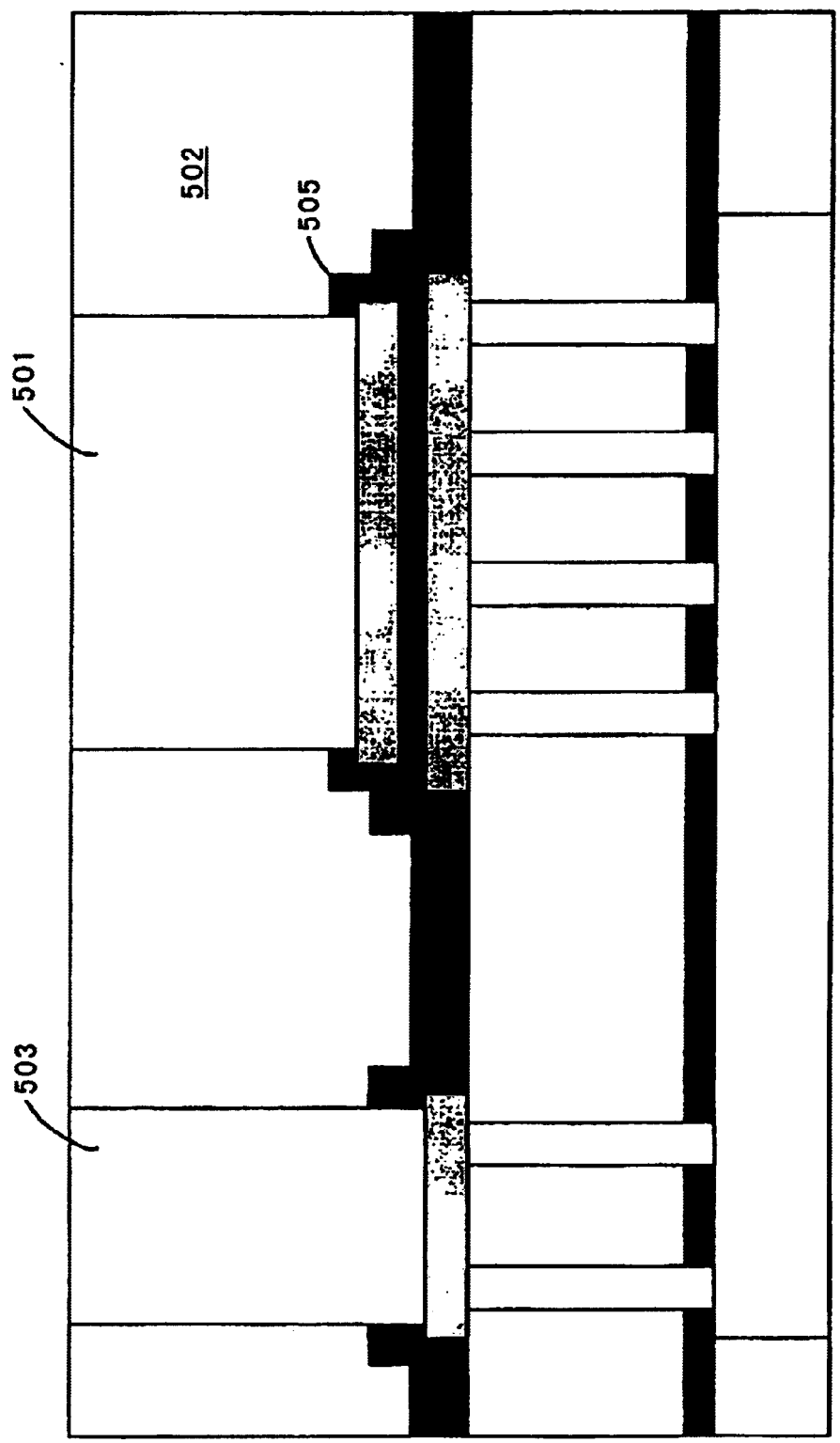

Referring to FIG. 5, the method also includes a capping layer 505 formed overlying the second barrier metal layer for the capacitor structure and interconnect structure. The capping layer can include any suitable material, including silicon nitride (e.g., PE CVD nitride), and other low temperature materials. An interlayer dielectric material 502 is formed overlying the capping layer. The interlayer dielectric material includes an upper surface. The interlayer dielectric material can be selected from an oxide, a nitride, any combination of these, doped oxides, such as BPSG, FSG, PSG, and other low K materials. The interlayer dielectric material is patterned to form vias, which are filled 501, 503 using a metal material. The metal material can include copper material, which has been planarized. Of course, there are many variations, alternatives and modifications.

The above sequence of steps provides a method according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

A method according to an embodiment of the present invention can be briefly provided as follows:

1. Provide a substrate, e.g., silicon wafer;
2. Form an insulating layer overlying the substrate;
3. Form a copper metal interconnect layer overlying the insulating layer.
4. Form a capping layer overlying the copper interconnect metal layer to isolate the copper metal interconnect layer form overlying structures;
5. Form a first barrier metal layer (i.e., the first barrier metal layer is free from contact with the copper interconnect layer to define a first electrode structure;
6. Form an insulating layer overlying the first barrier metal layer to define a capacitor dielectric structure;
7. Form a second barrier metal layer overlying the insulating layer to define a second electrode structure;
8. Form an etch stop layer overlying the second barrier metal layer,
9. Form an interlayer dielectric material overlying the etch stop layer;
10. Form a plurality of via openings defined within a region of the interlayer dielectric layer from the upper surface through the etch stop layer to the second barrier metal layer;
11. Provide a copper fill material within each of the plurality of via openings to define a plurality of copper structure extending from the upper surface through the etch stop layer to the second barrier metal layer;
12. Form an upper metal layer formed overlying the plurality of copper metal structures; and
13. Perform other steps, as desired.

The above sequence of steps provides a method according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 6:
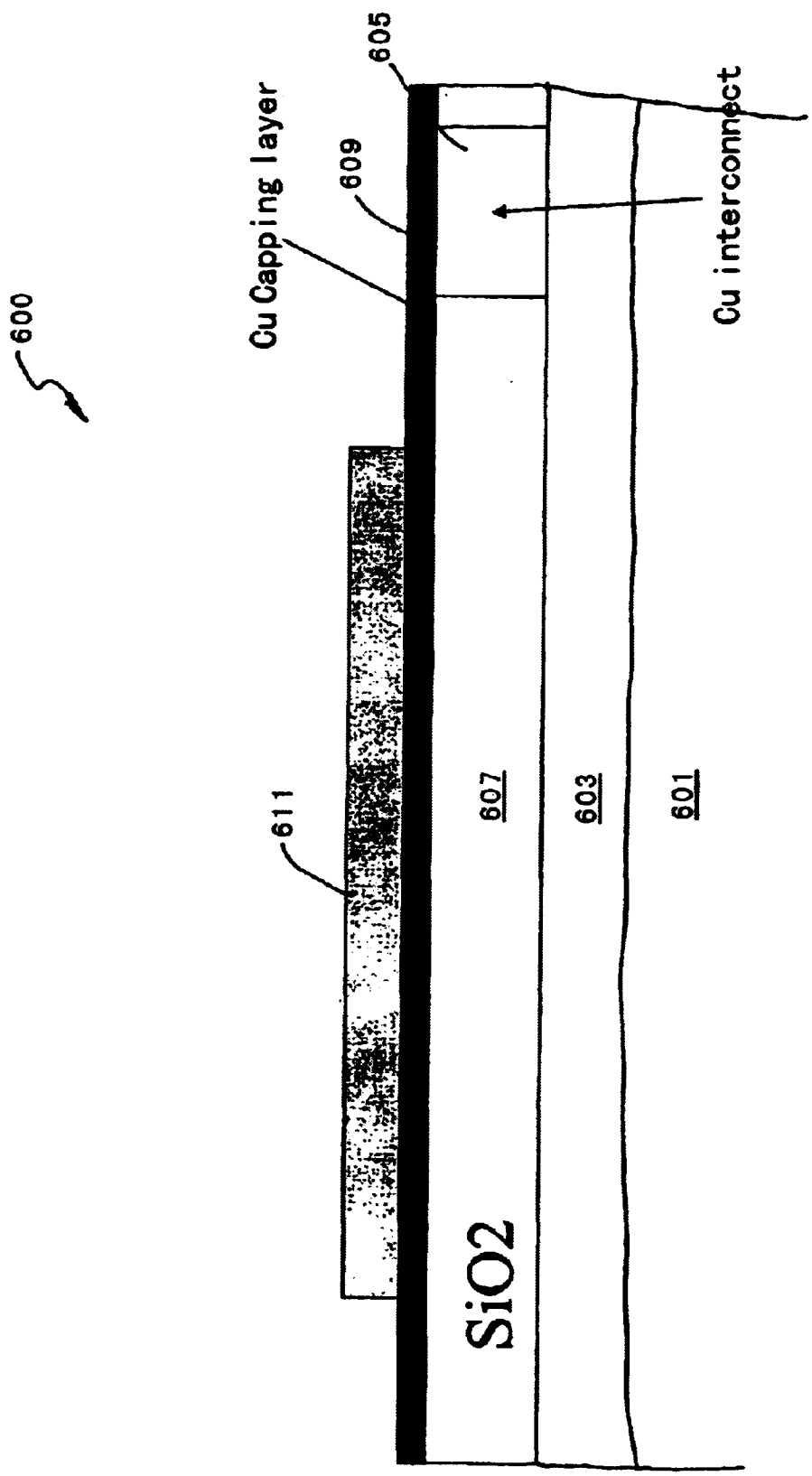
FIGS. 6 through 8 are simplified side-view diagrams of a method for forming a capacitor structure and resulting capacitor structure according to an embodiment of the present invention.
Figure 7:
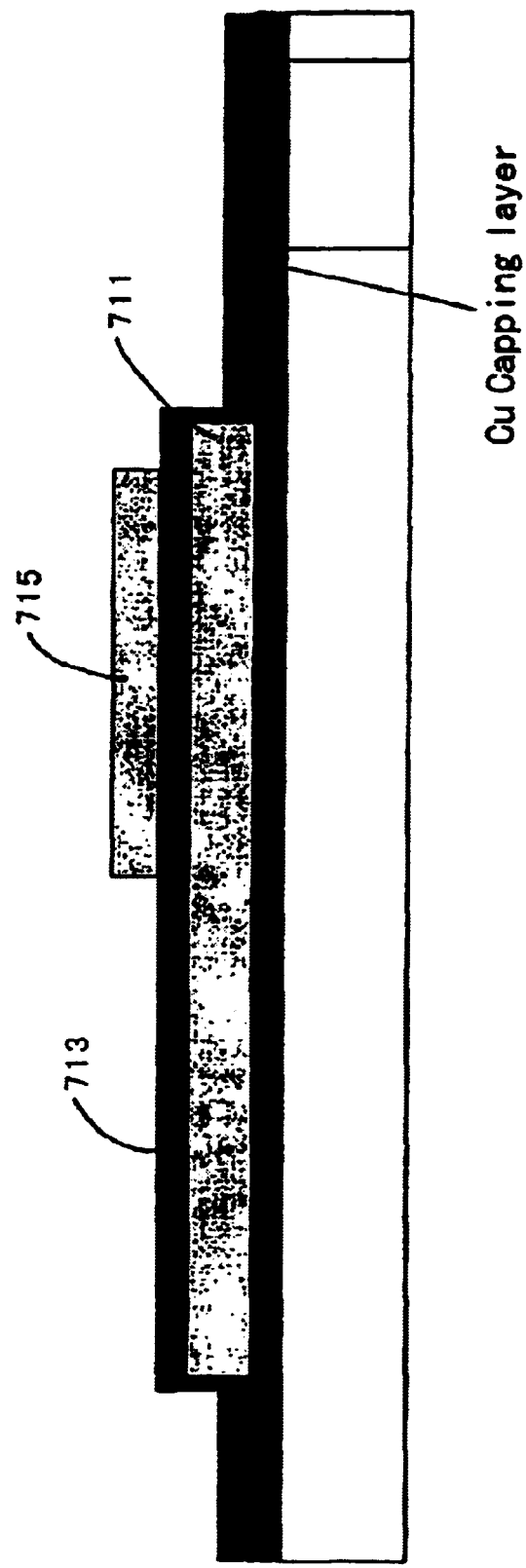
Figure 8:
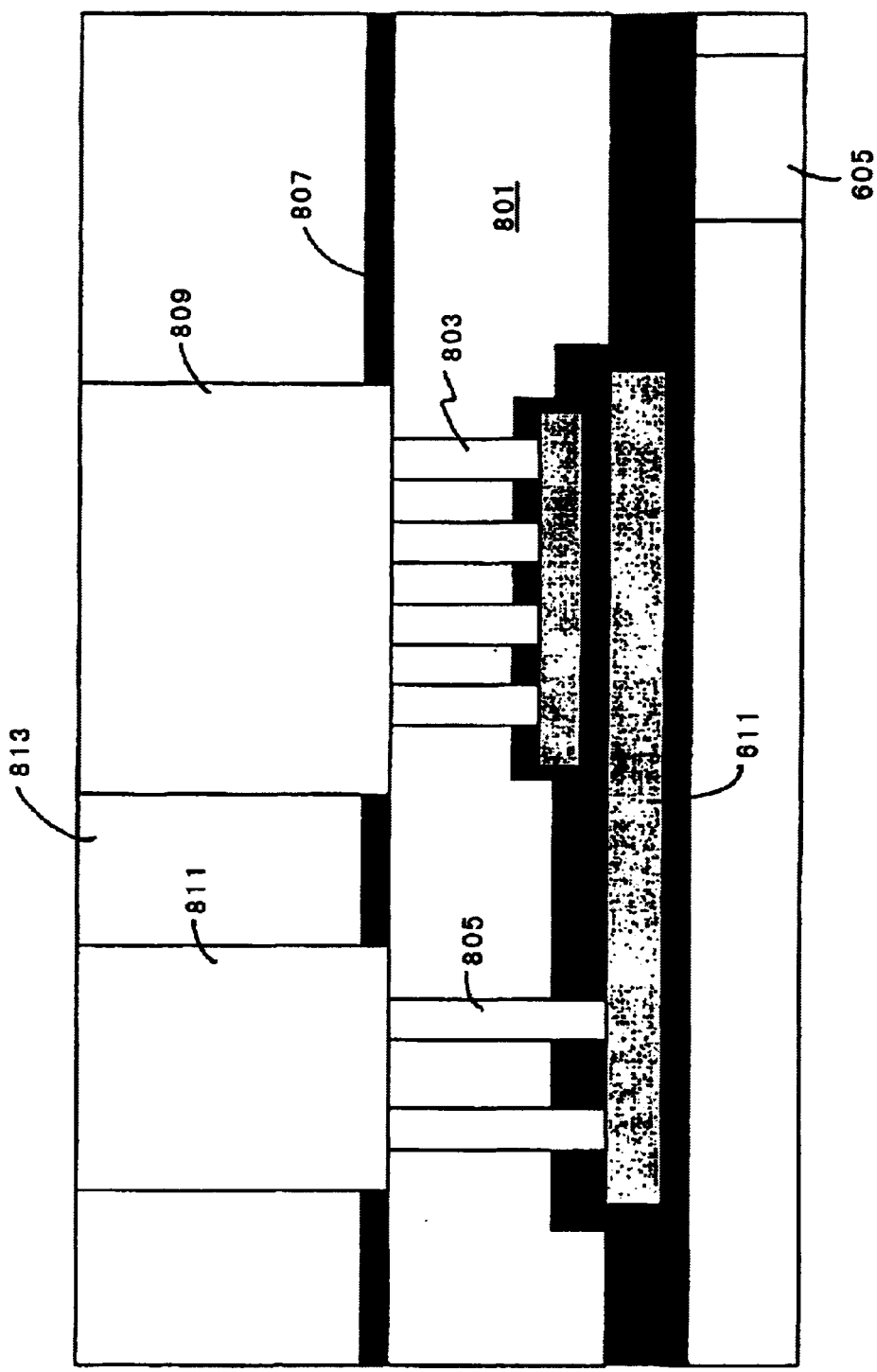

FIGS. 6 through 8 are simplified side-view diagrams 800 of a method for forming a capacitor structure and resulting capacitor structure according to an embodiment of the present invention. These diagrams are merely examples, which should not unduly limit the scope of the claims herein. One of ordinary skill in the art would recognize many limitations, variations, and alternatives. As shown, the method begins with substrate 601, which is a silicon wafer or the like. An overlying insulating layer 603 is formed over the surface of the substrate. The insulating layer can be silicon dioxide, silicon nitride, a combination of these, and other materials.

The method includes forming a copper metal interconnect layer 605 overlying the insulating layer. The copper layer is patterned using a damascene process. That is, copper layer is provided within insulating layer 607. The copper layer is then planarized using chemical mechanical polishing or other like processes. The copper layer has a surface that is substantially even with the surface of insulating layer 607. The method forms a capping layer 609 overlying the copper interconnect metal layer to isolate the copper metal interconnect layer form overlying structures. The capping layer can be a silicon nitride layer and other materials, which effectively allow processing of the device without interference with the copper interconnect layer. The method includes forming a first barrier metal layer 611 overlying the capping layer. At this time, the first barrier metal layer is free from contact with the copper interconnect layer. As such, the first barrier metal layer can be patterned using the capping layer as an etch stop, which prevents copper from interfering with the etching process of the barrier metal layer. The barrier metal layer, which is patterned, defines a first electrode structure of a capacitor. The barrier metal layer can include tantalum-bearing materials, such as tantalum nitride and tantalum, titanium bearing materials such as titanium and titanium nitride, as well as other alternatives.

Referring to FIG. 7, the method includes forming an insulating layer 711 overlying the first barrier metal layer to define a capacitor dielectric structure. The insulating layer can include silicon dioxide, silicon nitride, and combination of these, including multilayered structures and composites, and the like. The method includes forming a second barrier metal layer 713 overlying the insulating layer to define a second electrode structure for the capacitor. The barrier metal layer can include tantalum-bearing materials, such as tantalum nitride and tantalum, titanium bearing materials such as titanium and titanium nitride, as well as other alternatives.

The method includes forming an etch stop layer 715 overlying the second barrier metal layer. The etch stop layer is patterned in certain embodiments. The etch stop layer can include materials such as silicon nitride. Referring to FIG. 8, the method forms an interlayer dielectric material overlying the etch stop layer. The interlayer dielectric material includes an upper surface, which is planar. The method forms a plurality of via openings 801 defined within a region of the interlayer dielectric layer from the upper surface through the etch stop layer to the second barrier metal layer. The method fills each of the via openings with a copper fill material to define a plurality of copper structures extending from the upper surface through the etch stop layer to the second barrier metal layer. Preferably, any exposed portions of copper from the fill are planarized using chemical mechanical planarization or the like. The method forms a capping layer 807 overlying the dielectric material and plurality of copper structures. An upper metal layer is then formed 809 overlying the plurality of copper metal structures and within dielectric layer 813. The upper metal layer can be copper or other suitable material.

The present capacitor structure is formed along side with metal interconnect structures 811 805, which define the dual damascene copper structure. The interconnect structures include vias 805, which couple barrier metal layer 611 to upper metal layer 811. The barrier metal layer is overlying capping layer. The vias are defined within dielectric layer and extend from the metal layer to the upper metal layer 811, as indicated. The dielectric layer also includes planar surface 813. Such interconnect structure is made concurrently with the capacitor structure in preferred embodiments. Of course, there can be many alternatives, variations, and modifications.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit device, the device comprising:
   a substrate;
   an insulating layer overlying the substrate;
   a copper metal layer overlying the insulating layer;
   an etch stop layer overlying the copper metal layer;
   an interlayer dielectric material overlying the etch stop layer, the interlayer dielectric material including an upper surface;
   a plurality of via openings defined within a region of the interlayer dielectric layer from the upper surface through the etch stop layer to the copper metal layer;
   a copper fill material within each of the plurality of via openings to define a plurality of copper structure extending from the upper surface through the etch stop layer to the copper metal layer;
   a first barrier metal layer overlying each of the plurality of copper structures to define a first electrode of a capacitor structure;
   an insulating layer overlying the first barrier metal layer to define an insulating layer for the capacitor structure; and
   a second barrier metal layer overlying the insulating layer to define the second electrode.

2. The device claim 1 wherein the insulating layer is silicon nitride and the etch stop layer is nitride.

3. The device of claim 1 wherein the insulating layer has a thickness of about 200 to about 1000 Angstroms and more preferably 300 to 700 Angstroms.

4. The device of claim 1 wherein the insulating layer is PECVD nitride.

5. The device of claim 1 wherein the first barrier metal layer and the second barrier metal layer comprises a tantalum material or a titanium material.

6. The device of claim 1 wherein each of the plurality of metal structures has a width of less than 0.3 microns and a height of greater than about 7000 Angstroms.

7. The device of claim 1 wherein the capacitor structure has a capacitance ranging from about 0.5 to about 5 Fempto Farads per square micron.

8. The device of claim 1 further comprising a metal connector layer overlying the second barrier metal layer.

9. The device of claim 1 wherein the plurality of metal structures includes at least ten or more.

10. The device of claim 1 wherein the copper layer comprises a second portion, the second portion defines an interconnect layer.

11. An integrated circuit device, the device comprising:
   a substrate;
   an insulating layer overlying the substrate;
   a copper metal interconnect layer overlying the insulating layer;
   a capping layer overlying the copper interconnect metal layer to isolate the copper metal interconnect layer form overlying structures;
   a first barrier metal layer overlying the capping layer, the first barrier metal layer being free from the copper interconnect layer to define a first electrode structure;
   an insulating layer overlying the first barrier metal layer to define a capacitor dielectric structure;
   a second barrier metal layer overlying the insulating layer to define a second electrode structure;

an etch stop layer overlying the second barrier metal layer;

an interlayer dielectric material overlying the etch stop layer, the interlayer dielectric material including an upper surface;

a plurality of via openings defined within a region of the interlayer dielectric layer from the upper surface through the etch stop layer to the second barrier metal layer;

a copper fill material within each of the plurality of via openings to define a plurality of copper structure extending from the upper surface through the etch stop layer to the second barrier metal layer; and an upper metal layer formed overlying the plurality of copper metal structures.

12. The device of claim 11 wherein the capping layer and the first barrier metal layer maintain the capacitor insulating layer free from copper impurities.

13. The device of claim 11 wherein the capping layer maintains the capacitor-insulating layer free from copper impurities during subsequent processing of the device.

14. The device of claim 11 wherein the device is a mixed signal device having a frequency range from about 1 MHz and greater.

15. The device of claim 11 wherein the capping layer PE CVD nitride.

16. The device of claim 11 wherein the capping layer has a thickness of over 300 Angstroms.

17. A method for manufacturing integrated circuit devices, the method comprising:

providing a substrate;

forming an insulating layer overlying the substrate;

forming a copper metal interconnect layer overlying the insulating layer;

forming a capping layer overlying the copper interconnect metal layer to isolate the copper metal interconnect layer form overlying structures;

forming a first barrier metal layer overlying the capping layer, the first barrier metal layer being free from the copper interconnect layer to define a first electrode structure;

forming an insulating layer overlying the first barrier metal layer to define a capacitor dielectric structure;

forming a second barrier metal layer overlying the insulating layer to define a second electrode structure;

forming an etch stop layer overlying the second barrier metal layer;

forming an interlayer dielectric material overlying the etch stop layer, the interlayer dielectric material including an upper surface;

forming a plurality of via openings defined within a region of the interlayer dielectric layer from the upper surface through the etch stop layer to the second barrier metal layer, providing a copper fill material within each of the plurality of via openings to define a plurality of copper structure extending from the upper surface through the etch stop layer to the second barrier metal layer; and forming an upper metal layer formed overlying the plurality of copper metal structures.

18. The method of claim 17 further comprising planarizing exposed portions of the copper fill material.

19. The method of claim 17 wherein the upper metal layer comprises copper material.

20. A method for forming an integrated circuit device, the method comprising:

providing a substrate;

forming an insulating layer overlying the substrate;

forming a copper metal layer overlying the insulating layer;

forming an etch stop layer overlying the copper metal layer;

forming an interlayer dielectric material overlying the etch stop layer, the interlayer dielectric material including an upper surface;

forming a plurality of via openings defined within a region of the interlayer dielectric layer from the upper surface through the etch stop layer to the copper metal layer;

forming a copper fill material within each of the plurality of via openings to define a plurality of copper structure extending from the upper surface through the etch stop layer to the copper metal layer, forming a first barrier metal layer overlying each of the plurality of copper structures to define a first electrode of a capacitor structure;

forming an insulating layer overlying the first barrier metal layer to define an insulating layer for the capacitor structure; and forming a second barrier metal layer overlying the insulating layer to define the second electrode.

* * * * *